(12) United States Patent
Fishman et al.

(10) Patent No.: US 8,608,370 B1
(45) Date of Patent: Dec. 17, 2013

(54) COMBINATION HOLDING FURNACE AND ELECTROMAGNETIC STIRRING VESSEL FOR HIGH TEMPERATURE AND ELECTRICALLY CONDUCTIVE FLUID MATERIALS

(75) Inventors: Oleg S. Fishman, Maple Glen, PA (US); Mike Maochang Cao, Westampton, NJ (US)

(73) Assignee: Inductotherm Corp., Rancocas, NJ (US)

( * ) Notice: Subject to any disclaimer, the term of this patent is extended or adjusted under 35 U.S.C. 154(b) by 847 days.

(21) Appl. No.: 12/753,317

(22) Filed: Apr. 2, 2010

Related U.S. Application Data

(60) Provisional application No. 61/166,095, filed on Apr. 2, 2009.

(51) Int. Cl.
  *B01F 13/08* (2006.01)
  *C21C 7/00* (2006.01)

(52) U.S. Cl.
  USPC .......................... 366/273; 266/234

(58) Field of Classification Search
  USPC ........... 366/273, 274; 266/234; 164/468, 499; 416/3; 435/302.1; 417/420; 373/146
  See application file for complete search history.

(56) References Cited

U.S. PATENT DOCUMENTS

| | | | | |
|---|---|---|---|---|
| 3,314,670 A | * | 4/1967 | Kennedy | 266/234 |
| 4,178,979 A | * | 12/1979 | Birat et al. | 164/468 |
| 4,294,304 A | * | 10/1981 | Delassus | 164/504 |
| 8,101,119 B2 | * | 1/2012 | Taniguchi et al. | 266/234 |
| 2004/0028111 A1 | * | 2/2004 | Fishman et al. | 373/146 |
| 2010/0044934 A1 | * | 2/2010 | Taniguchi et al. | 266/234 |
| 2010/0163207 A1 | * | 7/2010 | Nikrityuk et al. | 164/499 |

FOREIGN PATENT DOCUMENTS

| | | | |
|---|---|---|---|
| JP | 64002777 A | * | 1/1989 |
| JP | 2009-74103 | * | 4/2009 |

* cited by examiner

*Primary Examiner* — Charles E Cooley
(74) *Attorney, Agent, or Firm* — Philip O. Post

(57) ABSTRACT

Apparatus for, and method of, containing, transferring and electromagnetically stirring an electrically conductive fluid is provided. A vessel is formed from spaced-apart annular structural elements, or hoops, that are bound together by a high-temperature electrical insulating material, which also forms the interior surface of the vessel. Reinforcing members are embedded in the high-temperature electrical insulating material and passed through the hoops. The vessel is disposed within an electrical stator having multiple electrical poles. Each pole is wound with a separate coil. Current can be supplied to each coil winding, with a suitable phase shift between currents to all coil windings, to achieve an electromagnetically induced stirring and heating of the electrically conductive fluid. The vessel may be removably disposed in the electrical stator so that the vessel can be transported to and from the electrical stator for induced stirring.

13 Claims, 4 Drawing Sheets

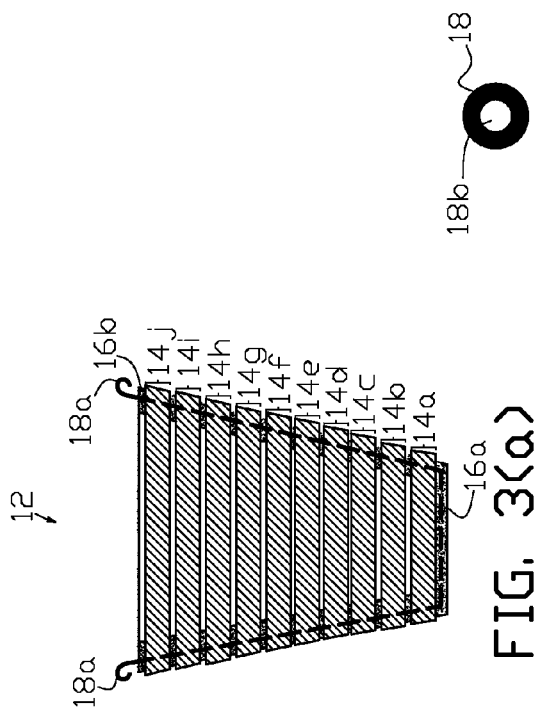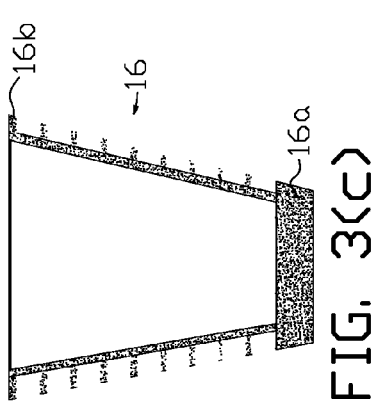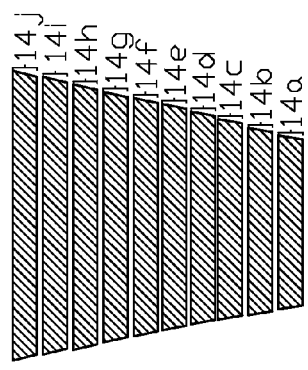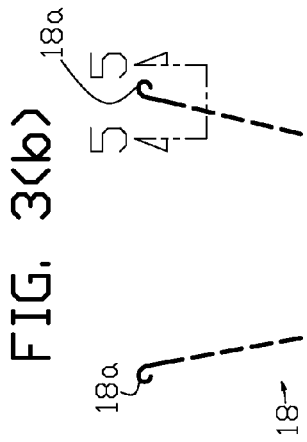
FIG. 3(a)
FIG. 3(b)
FIG. 3(c)
FIG. 3(d)
FIG. 5

COMBINATION HOLDING FURNACE AND ELECTROMAGNETIC STIRRING VESSEL FOR HIGH TEMPERATURE AND ELECTRICALLY CONDUCTIVE FLUID MATERIALS

CROSS REFERENCE TO RELATED APPLICATIONS

This application claims the benefit of U.S. Provisional Application No. 61/166,095, filed Apr. 2, 2009, hereby incorporated by reference in its entirety.

FIELD OF THE INVENTION

The present invention relates to a combination holding and electromagnetic stirring vessel for high temperature and electrically conductive fluid materials.

BACKGROUND OF THE INVENTION

Vessels for holding large volumes of an electrically conductive fluid material at high temperatures must have sufficient structural strength to support the contained material without deformation. For example silicon at its nominal melting point of 1410° C. has a nominal density of around 2500 kilograms per cubic meter; consequently a vessel holding a cubic meter of molten silicon would need to support about 2.5 tonnes of molten silicon. Typically a solid vessel constructed from a high strength material such as a stainless steel would be used as the holding vessel. However if the hot fluid material also needs to be electromagnetically stirred in the holding vessel by coupling the material with an alternating magnetic flux field originating external to the vessel, eddy currents induced in the solid stainless steel vessel would overheat and structural weaken the vessel. Additionally the resulting electromagnetic forces will apply a torque to the vessel as opposed to the hot fluid material contained within the vessel.

It is on object of the present invention to provide a combination holding and electromagnetic stirring vessel for an electrically conductive fluid material particularly when the fluid material is at high temperature.

It is another object of the present invention to provide a high structural strength vessel for transporting high density electrically conductive fluids or molten materials, and a stationary apparatus for electromagnetically stirring the materials in the vessel when the vessel is deposited in the stationary apparatus.

BRIEF SUMMARY OF THE INVENTION

In one aspect the present invention is apparatus for, and method of holding and electromagnetically stirring a fluid material at high temperatures, for example, when the fluid material is a molten metal or other molten material, such as silicon, which has a high melting temperature. A high strength vessel is formed by reinforcing a plurality of annular high strength structural elements that are separated from each other by a refractory with an interconnected system of reinforcing elements embedded in the annular structural elements and refractory. The vessel is disposed within the poles of a stator, and windings associated with each stator are connected to an alternating current source to induce a horizontally oriented cylindrical stir pattern in the fluid material.

In another aspect the present invention is an apparatus for containing, transporting and electromagnetically stirring an electrically conductive material. The apparatus comprises a vessel that can be optionally deposited into, and removed from within an electrical stator. The electrical stator has a plurality of electrical poles with a separate coil wound around each of the plurality of electrical poles. Each of the electrical coils is connected to a current source having phase-shifted current output to each of the electrical coils. The vessel comprises a plurality of annular structural elements formed from a high strength material having a yield strength sufficient to withstand the temperature and density of the electrically conductive material contained by the vessel. The plurality of annular structural elements are generally horizontally oriented and vertically spaced-apart from each other. A high-temperature electrical insulating material is disposed at least between the spaced-apart plurality of annular structural elements and forms the interior surface of the vessel. One or more reinforcing members are embedded in the high-temperature electrical insulating material and passed through at least one of the plurality of annular structural elements.

In another aspect the present invention is a method of containing, transporting and electromagnetically stirring a molten electrically conductive material. The molten electrically conductive material is deposited in a vessel comprising a plurality of annular structural elements formed from a high strength material having yield strength sufficient to withstand the temperature and density of the contained molten electrically conductive material. The plurality of annular structural elements are generally horizontally oriented and vertically spaced-apart from each other. A high-temperature electrical insulating material is disposed at least between the spaced-apart plurality of annular structural elements and forms the interior surface of the vessel. Reinforcing members are embedded in the high-temperature electrical insulating material and passed through at least one of the plurality of annular structural elements. An empty vessel, or the vessel containing the molten electrically conductive material, can be deposited within an electrical stator having a plurality of electrical poles with a separate coil wound around each of the plurality of electrical poles. Each of the coils can be supplied with a phase-shifted alternating current to electromagnetically induce a stir flow within the molten electrically conductive material and to inductively heat the molten electrically conductive material. An empty vessel, or vessel containing the molten electrically conductive material can be removed from the electrical stator.

The above and other aspects of the invention are set forth in this specification and the appended claims.

BRIEF DESCRIPTION OF THE DRAWINGS

The foregoing brief summary, as well as the following detailed description of the invention, is better understood when read in conjunction with the appended drawings. For the purpose of illustrating the invention, there is shown in the drawings exemplary forms of the invention that are presently preferred; however, the invention is not limited to the specific arrangements and instrumentalities disclosed in the following appended drawings:

FIG. 3(a) through FIG. 3(d) illustrate in cross sectional elevation through line 2-2 in FIG. 1 selected components of a holding vessel disposed within an electrical stator of the apparatus shown in FIG. 2; FIG. 3(a) is the assembled holding vessel; FIG. 3(b) shows the annular structural elements of the holding vessel; FIG. 3(c) shows the high-temperature electrical insulating material of the holding vessel; and FIG. 3(*d*) shows the reinforcing members of the holding vessel.

FIG. 4(*b*) is a vector diagram illustrating phase sequence rotation of current in the pole windings for the power supply configuration shown in FIG. 4(*a*) for one example of the invention.

FIG. 5 illustrates in cross sectional view through line 5-5 in FIG. 3(*d*) a cooling medium passage through reinforcing members of the holding vessel.

DETAILED DESCRIPTION OF THE INVENTION

Figure 1:
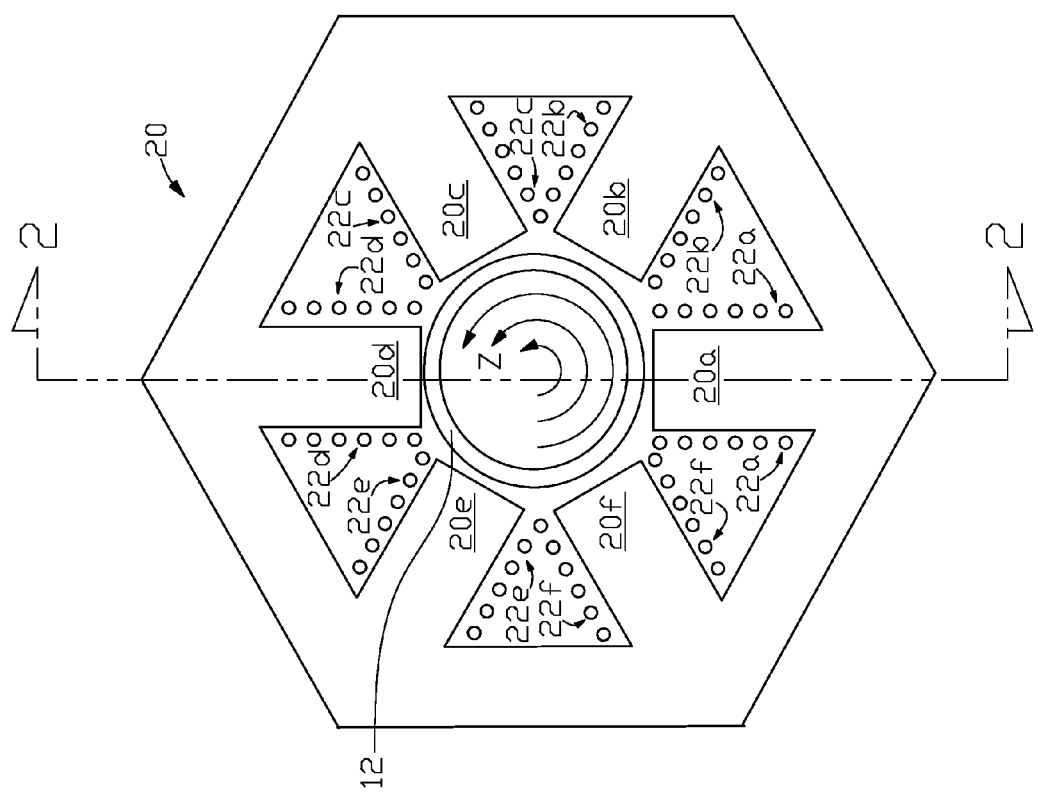
FIG. 1 illustrates a top elevational view of one example of an apparatus of the present invention.
Figure 2:
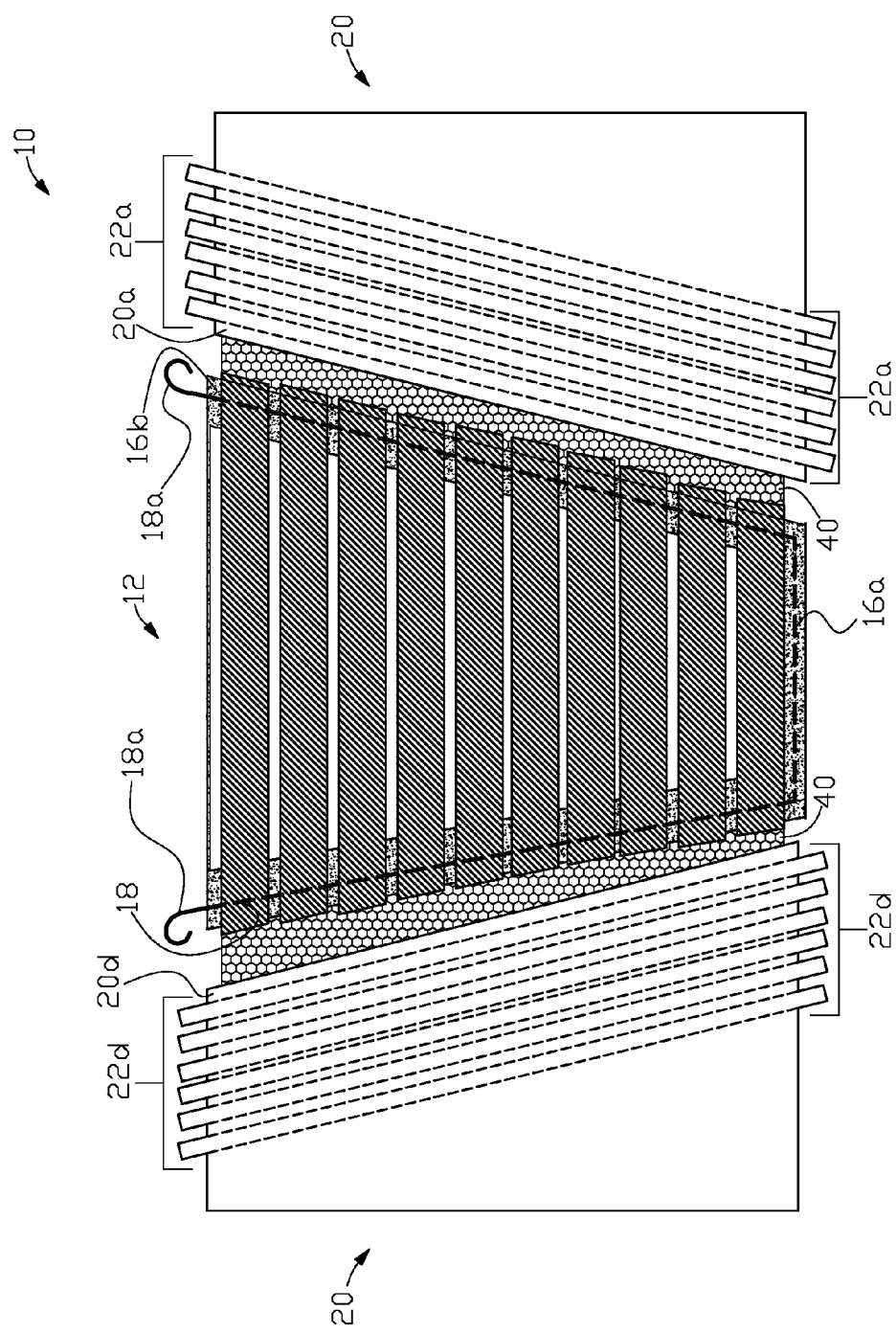
FIG. 2 illustrates in cross sectional elevation through line 2-2 in FIG. 1 the apparatus shown in FIG. 1.

There is shown in FIG. 1, FIG. 2 and FIG. 3(*a*) through FIG. 3(*d*) one example of apparatus 10 for combination holding and electromagnetic stirring of an electrically conductive fluid material. The material may be, for example, molten steel or silicon, and is generically referred to as "fluid material." Holding vessel 12 comprises a series of generally horizontally oriented annular structural elements 14*a* through 14*j* (FIG. 3(*a*) and FIG. 3(*b*)) formed from a high strength material such as a stainless steel. The material is selected for a particular application so that the material has sufficient yield strength to withstand the density and temperature of the fluid material to be contained by the vessel. The annular structural elements, or "hoops," are vertically spaced-apart from each other to mitigate induced eddy current heating in the hoops as further described below. Castable refractory 16 is disposed at least in the spaces between the hoops to bind the hoops together, and to form the interior (wall and bottom) surface of the holding vessel. In some examples of the invention, the refractory may also form the exterior surface of the holding vessel by coating over the annular structural elements; in these examples, the annular structural elements will be embedded within the refractory. Other high-temperature electrical insulating material, such as a silica oxide, alumina oxide, or a silicon nitride composition, or combinations thereof, may be used for a particular application, although the term "refractory" is used herein to encompass alternative materials. If required, an interior lining material can be provided to prevent contamination of the fluid material contained in the vessel with a component in the refractory. One or more embedded reinforcing members 18 are provided. Preferably reinforcing member 18 is an interconnected structural element that runs through: the bottom refractory 16*a*; each annular structural element (14*a* through 14*j*); and top rim refractory 16*b* as shown, for example, in FIG. 2. Embedded members 18 may be, for example, either solid or stranded rods or cables formed from, for example, a stainless steel composition that are interconnected to form an integral supporting frame structure within the annular structural elements and refractory. If the embedded members are formed from an electrically conductive material, electrical insulators, or other electrical discontinuity elements, may be required in the embedded members to limit induced current flow in the embedded members. In some examples of the invention, the embedded members may also include a through cooling medium passage 18*b* as shown in FIG. 5 to allow cooling of vessel 12 (primarily cooling of the annular structural elements) by flowing a cooling medium, such as water, through the cooling passages. Although the example vessel in the figures is formed in the shape of a trapezoidal closed bottom vessel, the present invention may also be utilized in closed bottom vessels of other shapes, such as semispherical, or open bottom vessels, such as those employed in continuous casting applications.

Figure 4B:
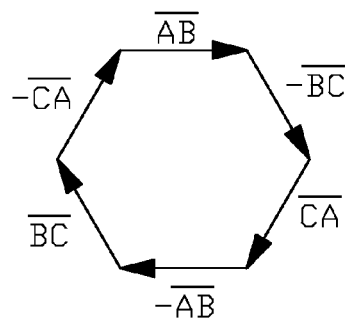
FIG. 4(*a*) is a simplified electrical schematic of one example of a power supply used to supply current to the pole windings shown in FIG. 1 and FIG. 2.
Figure 4A:
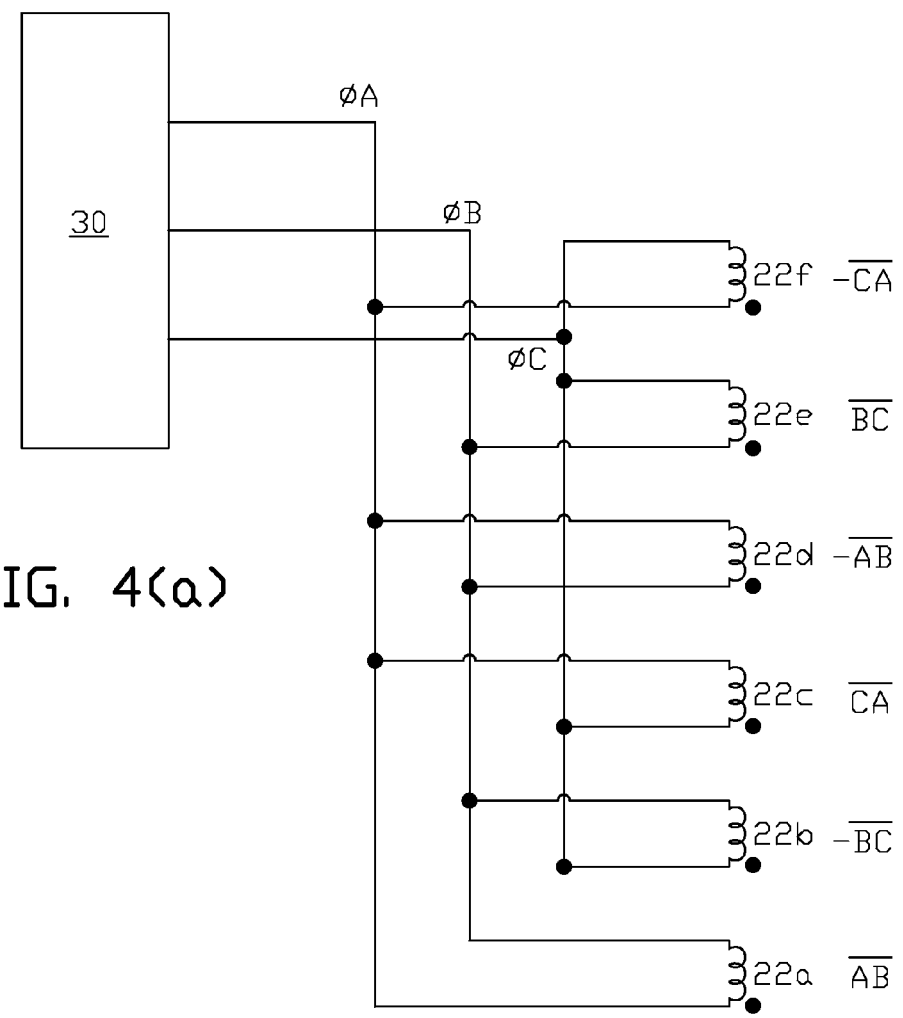

Vessel 12 is disposed within electrical stator 20 that is formed from a suitable electrical steel. Generally the interior opening of the stator, which is established by the interior stator poles, is configured for seating the vessel within the stator. In the example shown in the figures, each one of stator poles 20*a* though 20*f* (FIG. 1) is wound with a separate coil winding (22*a* through 22*f* respectively) that is connected to one or more suitable alternating current power sources. For example as shown in FIG. 4(*a*) three phase alternating current supply 30 can be used to supply power to windings 22*a* through 22*f* according to the phasing arrangement shown in FIG. 4(*b*). This arrangement will produce pole flux fields that couple with the electrically conductive fluid material in the vessel to induce a horizontally oriented cylindrical stir pattern as indicted by arrows Z in FIG. 1. The power supply may be electrically configured in any suitable arrangement for the application, such as a current or voltage fed inverter that may operate at constant or variable frequency, and with or without pulse width modulation. Typically the stir frequency is relatively low, that is, typically within the range of 5 Hertz, so as to minimize fluid perturbations that deviate from the horizontally oriented cylindrical stir pattern.

In some examples of the invention, vessel 12 is permanently disposed within stator 20. Alternatively, in other examples of the invention, vessel 12 may be provided with lifting apparatus so that the vessel can be lifted out from within stator 20 for transfer of vessel 12 (either empty or filled with molten material). For example, lifting apparatus such as hooks 18*a* may be integrated into embedded reinforcing members 18 to provide points of connection for lifting hoists or other lift equipment. In all examples of the invention, a high-temperature thermal insulating material 40, such as a bubbled ceramic, may be provided between the exterior side wall of vessel 12 and the interior facing sides of the stator poles as shown in FIG. 2.

While a horizontally oriented cylindrical stir pattern is utilized in the above examples of the invention, in other examples of the invention a toroidal vortex ("donut") shaped stir pattern may be utilized by suitable reorientation of the stator poles or utilization of one or more induction coils helically surrounding the exterior height of the vessel.

The number and arrangement of stator electrical poles will vary depending upon the particular application of the present invention.

The above examples of the invention have been provided merely for the purpose of explanation and are in no way to be construed as limiting of the present invention. While the invention has been described with reference to various embodiments, the words used herein are words of description and illustration, rather than words of limitations. Although the invention has been described herein with reference to particular means, materials and embodiments, the invention is not intended to be limited to the particulars disclosed herein; rather, the invention extends to all functionally equivalent structures, methods and uses. Those skilled in the art, having the benefit of the teachings of this specification, may effect numerous modifications thereto, and changes may be made without departing from the scope of the invention in its aspects.

The invention claimed is:

1. An apparatus for containing and electromagnetically stirring an electrically conductive material, the apparatus comprising:
   a vessel comprising:

a plurality of annular structural elements formed from a high strength material having a yield strength sufficient to withstand the temperature and density of the electrically conductive material contained by the vessel, the plurality of annular structural elements generally horizontally oriented and vertically spaced-apart from each other;

a high-temperature electrical insulating material disposed at least between the spaced-apart plurality of annular structural elements, the high-temperature electrical insulating material forming an interior surface of the vessel; and one or more reinforcing members embedded in the high-temperature electrical insulating material and passed through at least one of the plurality of annular structural elements;

an electrical stator for depositing the vessel within, the electrical stator having a plurality of electrical poles;

a separate coil wound around each of the plurality of electrical poles; and at least one power supply having a phase-shifted alternating current output for each one of the separate coils.

2. The apparatus of claim 1 further comprising a high-temperature thermal insulating material disposed between an outer wall of the vessel and an interior facing side of each one of the plurality of electrical poles.

3. The apparatus of claim 1 wherein the vessel is removably deposited within the electrical stator, the vessel further comprising a lifting apparatus for depositing the vessel within the electrical stator and for removing the vessel from within the electrical stator.

4. The apparatus of claim 3 wherein the lifting apparatus is integrally formed with the one or more reinforcing members.

5. The apparatus of claim 1 wherein the plurality of annular structural elements comprise a stainless steel and are arranged to form a trapezoidal closed bottom vessel.

6. The apparatus of claim 1 wherein the high-temperature electrical insulating material is selected from the group consisting of a silica oxide, an alumina oxide and a silicon nitrite.

7. The apparatus of claim 1 wherein the one or more reinforcing members are interconnected and run through the high-temperature electrical insulating material and the plurality of annular structural elements.

8. The apparatus of claim 1 wherein the one or more reinforcing members further comprise an interior passage within the one or more reinforcing members through which a cooling medium can be circulated.

9. A method of containing and electromagnetically stirring a molten electrically conductive material, the method comprising the steps:

depositing the molten electrically conductive material in a vessel comprising a plurality of annular structural elements formed from a high strength material having a yield strength sufficient to withstand the temperature and density of the deposited molten electrically conductive material, the plurality of annular structural elements generally horizontally oriented and vertically spaced-apart from each other; a high-temperature electrical insulating material disposed at least between the spaced-apart plurality of annular structural elements, the high-temperature electrical insulating material forming an interior surface of the vessel; and one or more reinforcing members embedded in the high-temperature electrical insulating material and passed through at least one of the plurality of annular structural elements;

lifting the vessel containing the molten electrically conductive material by a lifting apparatus attached to the vessel;

depositing the vessel within an electrical stator having a plurality of electrical poles with a separate coil wound around each of the plurality of electrical poles; and supplying a phase-shifted alternating current to each of the coils to electromagnetically induce a stir flow within the molten electrically conductive material.

10. The method of claim 9 further comprising the step of adjusting the phase-shifted alternating current to each of the coils to electromagnetically induce the stir flow within the molten electrically conductive material in a horizontally oriented cylindrical stir pattern.

11. The method of claim 9 further comprising the step of lifting the vessel containing the molten electrically conductive material by the lifting apparatus from within the electrical stator.

12. An apparatus for containing and electromagnetically stirring an electrically conductive material, the apparatus comprising:

a vessel comprising:

a plurality of annular structural elements formed from a stainless steel, the plurality of annular structural elements generally horizontally oriented and vertically spaced-apart from each other to form a trapezoidal closed bottom vessel;

a high-temperature electrical insulating material disposed between the spaced-apart plurality of annular structural elements, the high-temperature electrical insulating material forming an interior wall and a bottom surface of the trapezoidal closed bottom vessel; and a plurality of reinforcing members embedded in the high-temperature electrical insulating material and passed through the plurality of annular structural elements;

an electrical stator for depositing the trapezoidal closed bottom vessel within, the electrical stator having a plurality of electrical poles;

a separate coil wound around each of the plurality of electrical poles; and a power supply having a phase-shifted alternating current output for each of the separate coils.

13. The apparatus of claim 12 further comprising a high-temperature thermal insulating material disposed between an outer wall of the trapezoidal closed bottom vessel and an interior facing side of each one of the plurality of electrical poles.

* * * * *